United States Patent
Chan et al.

(10) Patent No.: US 6,313,541 B1
(45) Date of Patent: Nov. 6, 2001

(54) BONE-PAD WITH PAD EDGE STRENGTHENING STRUCTURE

(75) Inventors: Chin-Jong Chan; Shi-Tron Lin, both of Hsinchu (TW)

(73) Assignee: Winbond Electronics Corp., Hsinchu (TW)

(*) Notice: Subject to any disclaimer, the term of this patent is extended or adjusted under 35 U.S.C. 154(b) by 0 days.

(21) Appl. No.: 09/327,876

(22) Filed: Jun. 8, 1999

(51) Int. Cl.[7] .......................... H01L 23/48; H01L 23/52; H01L 23/40
(52) U.S. Cl. .................... 257/786; 257/773; 257/774; 257/775; 257/784; 257/781; 257/690; 257/750
(58) Field of Search .................. 257/773, 775, 257/786, 784, 781, 774, 750

(56) References Cited

U.S. PATENT DOCUMENTS

| | | | |
|---|---|---|---|
| 5,844,317 | * 12/1998 | Bertolet et al. | 257/773 |
| 5,891,745 | * 4/1999 | Dunaway et al. | 438/18 |
| 5,962,919 | * 10/1999 | Liang et al. | 257/748 |
| 5,981,302 | * 11/1999 | Alswede et al. | 438/15 |
| 6,130,459 | * 10/2000 | Intrater | 257/355 |
| 6,181,016 | * 1/2001 | Lin et al. | 257/786 |

FOREIGN PATENT DOCUMENTS 59-043536 * 3/1984 (JP) .......................... 21/60
63-062341 * 4/1988 (JP) .......................... 21/66

* cited by examiner

Primary Examiner—Tom Thomas
Assistant Examiner—Nitin Parekh
(74) Attorney, Agent, or Firm—W. Wayne Liauh

(57) ABSTRACT

A bond pad structure for use in wire bonding applications during the packaging of semiconductor devices with reduced bond pad lift-off problem. The bond pad structure contains: (a) a metal bond pad formed in an open window area surrounded by an edge portion of a dielectric layer; and (b) at least one dendritic sub-structure formed in the edge portion of the dielectric layer. The at least one dendritic sub-structure is formed of a metal material and is in contact with the metal bond pad. The dendritic sub-structure is a generally cross-shaped structure containing a first segment which is generally perpendicular to an edge of the metal bond pad to which the dendritic sub-structure is connected, and a second segment with is generally parallel to the edge. The dendritic sub-structure serves two main purposes. First, it creates an augmented contact area, and thus enhanced adhesive force, for the bond pad due to the newly created vertically extending contact surface between the metal bond pad layer and the dielectric layer in the dendritic sub-structure. Second, the dendritic sub-structure creates a discontinuity in the edge portion of the dielectric layer which can effectively intercept and thus stop the growth of cracks after they are formed. Unlike augmented bond pads of prior art, the bond pad structure does not contain anchor structures underneach the bond pad where wire bonding is to be made.

21 Claims, 5 Drawing Sheets

BONE-PAD WITH PAD EDGE STRENGTHENING STRUCTURE

FIELD OF THE INVENTION

The present invention relates to a novel bond-pad for use in semiconductor packaging applications with improved stability. More specifically, the present invention relates to a novel bond-pad structure which eliminates or at least minimizes the bond-pad lift-off (or peeling-off) problems often encountered during the wire bonding step in the packaging of integrated circuits (ICs). With the novel bond-pad structure of the present invention, the failure rate in yield due to bond-pad lift-off can be substantially reduced without requiring major modifications in the fabrication process or facility. The present invention also relates to a novel process which implements the improved bond-pad design to increase the production yield so as to reduce the overall production costs for the manufacturing of integrated circuit packages, as well as to the printed circuit boards (PCBs) or other integrated circuit packages that incorporate the novel bond-pad structure disclosed herein.

BACKGROUND OF THE INVENTION

During the formation of printed circuit boards (PCBs) or other integrated circuit (IC) packaging processes, the semiconductor devices provided in the printed circuit board can be respectively connected to the outside via a wire-bonding process. In such a process, one or more bonding pads are provided which are in contact with respective parts of the semiconductive device at the outer-most conductive layer thereof. Then, a bonding wire is bonded onto the bond pad so as to allow the semiconductor device to make electric contact with the inner lead of the IC package. Typically, the wire bonding process can be approximately categorized into two main types: the gold wire/gold ball bonding process and the aluminum wire wedge bonding process. The aluminum wire wedge bonding process is widely used in chip-on-board (COB) applications in which the aluminum wire is welded to the bond pad via a combination of ultrasonic vibrations and pressure applied to the wedge. The gold wire/gold ball bonding process is typically accomplished by pressing the wire, which is first formed into a ball, against the bond pad at an elevated temperature. The aluminum wire wedge bonding process is generally less accurate in establishing the bonding position and less uniform in the applied bonding pressure, and, hence, it is more prone to the bond peel-off problem relative to the gold wire/ball bonding process, mainly due to the non-uniformity of mechanical and/or thermal stresses.

The bond peel-off problem occurs when the adhesion force between any adjacent layers in the multi-layer structured semiconductor device is not strong enough to resist the thermal and mechanical stress that may be present during the wire bonding process to bond the bonding wire to the bond pad. This can occur, for example, between the metal bond pad and the underlying polysilicon layer, between a metal layer and a dielectric layer, between a dielectric layer and a polysilicon layer, and between a barrier layer and a dielectric layer, etc.

Bond-pad peeling-off or lift-off, in addition to that discussed above, has been a major unsettling problem besetting the integrated circuit packaging industry involving the wire bonding technology. Many possible solutions have been suggested and implemented, as illustrated in the following prior art references.

U.S. Pat. No. 4,060,828 discloses a semiconductor device having a multi-layer wiring structure with an additional through-hole interconnection formed in the insulating layer beneath the bonding pad of the wiring layer. The purpose of the '828 patent is to provide additional, and protected, electrical contact between the bonding pad and another wiring layer therebelow, such that if the exposed portion of the bonding pad is corroded and thus becoming disconnected, the additional electrical contact formed through the insulation layer can still provide the needed connection. While the '828 patent does not directly address the bond pad peel-off problem, the concept of providing a through-hole interconnection structure in the insulation layer immediately underlying the metal layer as disclosed in the '828 patent has been adopted, though mostly in modified form, by essentially all the prior art processes dealing with solving the problem of bond pad peel-off to provide an anchored structure.

U.S. Pat. No. 4,981,061 discloses a semiconductor device which comprises a first insulating layer formed on the major surface of the semiconductor substrate including an active region. A first contact hole is formed at a position in the first insulating layer corresponding to the active region and a first conductive layer is formed in the first contact hole and a portion of the first insulating layer around the contact hole. Then a second insulating layer is formed on the first conductive layer and the first insulating layer, and a second contact hole is formed at a position in the second insulating layer corresponding to the first conductive layer and located above the first contact hole. Subsequently, a second conductive layer is formed on the second insulating layer and fills the second contact hole. Finally a bonding wire is connected to the second conductive layer in regions located above the first and second contact holes. With the structure disclosed in the '061 patent, the pressure applied to the second insulating layer during wire bonding is supported by columnar portions of the first and second conductive layers filled in the first and second contact holes. Thus, the pressure acting on the second insulating layer is reduced to suppress occurrence of cracks.

U.S. Pat. No. 5,309,205 discloses a bond pad structure which is formed by depositing a barrier layer over an underlying region of a semiconductor device, and then depositing a first conductive layer over the barrier layer. The barrier layer and conductive layer are then patterned and etched to define a conductive region. In the '205 patent, the conductive region is formed in the shape of a grid, and a second conductive layer is deposited over the conductive region and a portion of the exposed underlying region. The second conductive layer makes a good adhesive contact with the underlying region, thus preventing bond pad lift off.

U.S. Pat. No. 5,248,903 discloses a bond pad structure which alleviates bond pad lift problems encountered during wire bonding by providing a composite bond pad, which includes an upper bond pad and a lower bond pad, and an insulating component therebetween. At least one opening is provided through the insulating component, extending from the bottom bond pad to the upper bond pad. The at least one opening is aligned with a peripheral region of the bottom bond pad. A conductive material is then provided which fills the plurality of openings, and electrically connects the top and bottom bond pads. The at least one opening can be a plurality of conductive vias, a ring-like opening extending around the peripheral region, or one or more elongated slit-like openings.

U.S. Pat. No. 5,309,025 discloses an improved bond pad structure which reduces bond pad lift off problems. The bond pad disclosed in the '025 patent includes a barrier layer, and is formed by first depositing a barrier layer over an underlying region of a semiconductor device, and then depositing a first conductive layer over the barrier layer. The barrier layer and the conductive layer are then patterned and etched to define a conductive region. A plurality of the conductive regions are formed each of which is isolated from the ourside by the formation of an insulative sidewall. A second conductive layer is deposited over the conductive region and a portion of the exposed underlying region. The second conductive layer makes a good adhesive contact with the underlying region, thus preventing bond pad lift off.

U.S. Pat. No. 5,707,894 discloses an improved bonding pad structure and the process for forming the same which reduces the bond pad peeling problem between the bonding pad layer and an underlying layer. The method disclosed in the 894 patent comprises the steps of first forming a plurality of anchor pads on the substrate surface in the bonding pad area. Next, a first insulating layer is formed over the substrate surface and the anchor pads. A plurality of via holes are formed through the first insulating layer which are filled with the same material as a second metal layer, which covers the first insulation layer, so as to form a conductive connection anchor pads and the second metal layer. The via holes have a smaller cross-sectional area than the anchor pads so that the combination of the anchor pads and the second metal form small "hooks" into the first insulating layer that hold the second metal layer (i.e., the bonding pad layer) to the underlying layer.

All of the prior art inventions discussed above failed to notice another important cause for the bond pad peel-off problems. It was observed by the co-inventors of the present invention that, very often, the bond pad peeling problem was found to be caused by cracks formed in or around one or more of the edge portions of the dielectric layer underlying corresponding portions of the metal bonding pad. Once a crack in the edge portion of the dielectric layer is formed due to the thermal and/or mechanical stress during the wire bonding process, it will propagate along the interface between the metal bonding pad and the dielectric layer, and eventually leading to the bond pad to be peeled off from the semiconductor device. Such a bond pad peel-off problem due to crack propagation becomes more profound as the bond pad size becomes smaller.

Furthermore, most of the inventions discussed above involve forming multiple metal-filled holes or vias through the insulation layer underneath the portion of the bond pad where bonding wire is to be attached wherein the heat rise is expected to be high. The multiple metal-filled vias are not interconnected to each other except indirectly at the top through their respective connections to the metal layer. If the multiple metal-filled vias are not laid out properly, or if the wire bonding is not applied on the location as designed, unequal heat transfers from the metal bond pad layer in the different metal-filled vias can cause undesirable thermal stress problems.

SUMMARY OF THE INVENTION

The primary object of the present invention is to develop an improved bond pad structure for use in wire bonding applications during the packaging operation of integrated circuit devices. More specifically, the primary object of the present invention is to develop an improved bond pad structure which minimizes the lift-off problem and is relatively easy to implement. The bond pad structure of the present invention can stop the growth of cracks when they are formed in the edge portion of the dielectric layer adjacent to the bond pad, which can also contribute to the bond peel-off. Another benefit that can be derived from the bond pad structure of the present invention is that it also eliminates the potential unbalanced heat transfer problems that can be experienced associated with the use of the multiple metal-filled anchoring structure as disclosed in the prior art references.

In the novel bond pad structure of the present invention, at least one dendritic sub-structure is formed extending from the edge portion of the metal bond pad into the adjacent dielectric layer. Viewed from a different angle, the present invention can be described as forming one or more dendritically-shaped through holes along the edge of the dielectric layer. The dendritically shaped through holes are then filled with a metal material which are interconnected to the edge of the metal bond pad to form one or more corresponding dendritic sub-structures.

The dendritic sub-structure of the present invention serves two main purposes. First, it creates an augmented contact area, and thus an enhanced adhesive force, for the metal bond pad, due to the newly created vertically extending contact surfaces between the metal bond pad layer and the dielectric layer in the dendritic sub-structure. But more importantly, the dendritic sub-structure creates a discontinuity in the edge portion of the dielectric layer which, when designed properly, can effectively intercept and thus stop the growth of cracks after they are formed. As discussed earlier, crack growth is one of the main reasons contributing to the bond pad peel-off. By stopping the crack growth and providing and enhanced adhesion, the novel bond pad design of the present invention has proven to be more effective than any of the prior art structures in preventing the bond pad lift-off problem. Also, since the novel bond pad of the present invention does not involve forming any vias or anchoring structures in the insulation layer in the area beneath the bond pad, it can be much more easily implemented. This procedural advantage translates into substantial cost savings.

The present invention can be advantageously implemented in a wide variety of bond pad configurations. One of the examples is a simple bond pad design wherein the bond pad 10 is formed directly on a polysilicon layer 2 as shown in FIG. 1. The bond pad metal layer 1 is typically extended to form an overhang portion 3 on top of the dielectric layer 4. Because the extent of the contacting surface, and thus the adhesive force so provided, is only very limited, the bond pad metal layer 1 can be peeled off when the vibrational or thermal stress exceeds a certain level. Most of the prior art methods, such as those discussed above, involve the concept of "elevating" the metal bond pad layer and extending the dielectric layer into the region directly underneath the bond pad so as to allow the formation of a multiplicity of vias or anchoring structures to provide the desired adhesion and thus stability.

In the present invention, at least one dendritically shaped through-hole is formed in the edge portion of the dielectric layer which is connected to and thus becomes an extension from (or tributary to) the bond pad open area (or the "window area") reserved for the bond pad. The dendritically shaped through-hole can be formed during the same masked etching step as in forming the bond pad open area. Subsequently, a bond pad metal layer is formed by deposition. The dendritically shaped through hole can be filled with a tungsten plug, or it can be filled with a metal material. However, since the width of the dendritically shaped through-hole typically is very small, the metal materials deposited on the side walls of the dendritically shaped through-hole typically merge with one another, thus causing the entire dendritic sub-structure to be filled to the top surface. During the deposition of bond pad metal layer, an overhang portion will also be formed on top of the dielectric layer, in areas both between the dendritic sub-structure and beyond. Because the overhang portion is most likely to be covered by a passivation layer, generally no planarization is required.

In all of the preferred embodiments of the present invention, the dendritic sub-structure has a "cross" shape, with the longer segment perpendicular to the edge of the bond pad and the short segment parallel thereto. Such an orthogonal cross-shaped dendritic sub-structure is the most effective geometric structure in intercepting crack growths and thus can most effectively stop the propagation of the cracks that may be formed in the edge portion of the dielectric layer due to the high vibrational and/or thermal stresses exerted during the wire bonding process. An array containing a plurality of such dendritic sub-structures can be formed along a part or an entire edge of a single or multiple sides of the bond pad. If necessary, a second level of the dendritic sub-structure can be "grown" (i.e., extended) from the end of the first level dendritic sub-structure.

BRIEF DESCRIPTION OF THE DRAWING

The present invention will be described in detail with reference to the drawing showing the preferred embodiment of the present invention, wherein.

DETAILED DESCRIPTION OF THE PREFERRED EMBODIMENT

The present invention discloses a novel bond pad structure for use in wire bonding applications during the packaging operation of integrated circuit devices which eliminates or at least minimizes the bond pad lift-off problems that have been found to be a main cause for reduced production yield. The novel bond pad structure disclosed in the present invention is relatively simply and more cost-effective to implement, and can be employed in a very wide range of bond pad configurations, from the simplest to the more complicated. Another advantage of the novel bond pad structure of the present invention is that, in addition to providing enhanced adhesion, it also eliminates the potential unbalanced heat transfer problems associated with using the multiple-anchor structure of the prior art design, and can stop the growth of cracks when they are formed in the edge portion of the dielectric layer adjacent to the bond pad.

Figure 1:
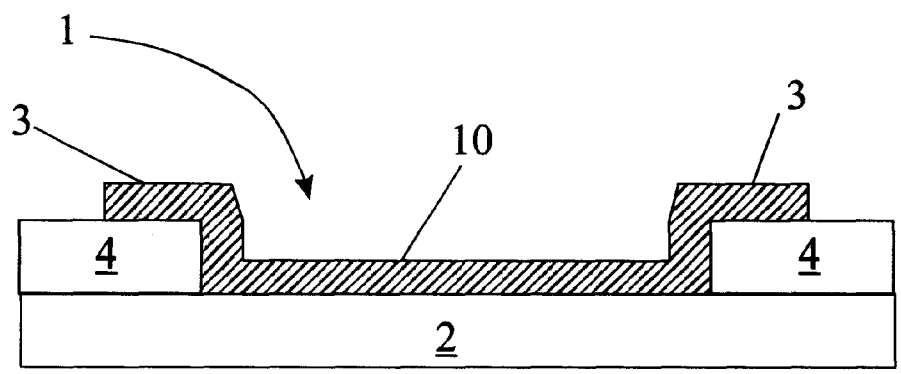
FIG. 1 is an illustrative schematic diagram showing a side view of a conventional bond pad structure without any anchoring structure.

FIG. 1 is an illustrative schematic diagram showing a side view of a conventional bond pad structure without any anchoring structure. Unlike many prior art designs, the present invention can be advantageously implemented in a wide variety of bond pad configurations, from the simplest to the very complicated. FIG. 1, which shows that a bond pad 10 is formed directly on a polysilicon layer 2, illustrates such flexibility. Typically, the bond pad metal layer 1 is extended to form an overhang portion 3 on top of the dielectric layer 4. Due to thermal and/or mechanical stress during bonding, cracks can be developed underneath the overhang. And the bond pad metal layer 1 may be peeled off when the vibrational or thermal stress exceeds the limited adhesion force. Most of the improved bond pad designs disclosed in the prior art intended to alleviate the bond pad peel-off problem have been using a general concept which involves the steps of: (1) depositing a dielectric layer on a metal or polysilicon layer, (2) forming a plurality of metal-filled vias or anchors in the insulation layer, and (3) forming the bond pad metal on top of the insulation layer in contact with those metal-filled vias and anchors. The present invention utilizes a totally different concept.

In the novel bond pad of the present invention, at least one dendritic sub-structure is formed extending from the edge portion of the metal bond pad into the adjacent dielectric layer. In implementing the present invention, the metal bond pad can be formed overlaying a wide variety of layers, such as a polysilicon layer, a metal polycide layer, a dielectric layer, a barrier layer, or another metal layer. The dendritic sub-structure is formed by first forming one or more dendritically shaped through-holes extending inwardly from the edge of the dielectric layer. The dendritically shaped holes are then filled with a metal material which then become interconnected to the edge of the metal bond pad to form one or more corresponding dendritic sub-structure.

As discussed above, in the present invention, at least one dendritic sub-structure is formed in the edge portion of the dielectric layer which is connected to and can be considered as an extension from the edge, or a tributary, of the bond pad open area (or the "window area") reserved for subsequently forming the bond pad by deposition of a metal layer. Typically, the dendritically shaped through-holes in the edge portion of the dielectric layer are formed in the same masked etching step as when the bond pad open area is formed. Subsequently, a bond pad metal layer is formed typically by chemical vapor deposition. While the dendritic sub-structure can be partially filled with the metal material and the rest subsequently filled with a passivation layer, because the width of the dendritic sub-structure typically is very small, the metal material deposited on the side walls of the dendritic sub-structure would merge, thus causing the entire dendritic through-holes in the dielectric layer to be completely filled to at least the top surface. Another option is to fill the dendritic sub-structure with tungsten plugs. This option would require an additional step. During the same metal deposition process, a metal overhang portion is also formed on top of the edge portion of the dielectric layer which can also be made to bury the dendritic sub-structure. Because the overhang portion is most likely to be covered by a passivation layer, generally no planarization is required.

Preferably, the dendritic sub-structure has a "cross" shape, with the long segment being perpendicular to the edge of the bond pad and the short segment parallel thereto. The cross-shaped dendritic sub-structure is preferred because it is the most effective configuration to intercept the crack growth and thus can most effectively stop the propagation of the cracks that may be formed in the edge portion of the dielectric layer due to the high vibrational and/or thermal stress exerted by the bonding wire during the wire bonding process. If necessary, a second level of the dendritic sub-structure can be formed which extends from the end of either the short or long portion of the first level of the dendritic sub-structure. Depending on the severity of the imposing stress, it may not be necessary to form the dendritic sub-structures along all the four edges of the bond pad. An array of dendritic sub-structures which are formed along only part of a single edge, or the entire length of a single edge, or a combination thereof, may be adequate in many situations.

Compared to the prior art improved bond pad designs, the dendritic sub-structure of the present invention can serve two main purposes. First, it creates an enhanced contact area, and thus enhanced adhesion force, for the bond pad along the newly created vertically extending contacting surface in the dendritic sub-structure. But more importantly, the dendritic sub-structure creates a discontinuity in the edge portion of the dielectric layer which, when laid out properly, can effectively intercept and thus stop the growth of cracks after they are formed. As discussed earlier, crack growth is one of the main reasons contributing to the bond pad peel-off problem. By stopping the crack growth and providing enhanced adhesion, the novel bond pad structure of the present invention has proven to be very effective in preventing the bond pad lift-off problem. Also, the dendritic sub-structure disclosed in the present invention can be applied in many other configurations. For example, it can also be applied as an add-on to those augmented bond pad structures disclosed in the prior art.

The present invention will now be described more specifically with reference to the following examples. It is to be noted that the following descriptions of examples, including the preferred embodiment of this invention, are presented herein for purposes of illustration and description, and are not intended to be exhaustive or to limit the invention to the precise form disclosed.

EXAMPLE 1

Figure 2:
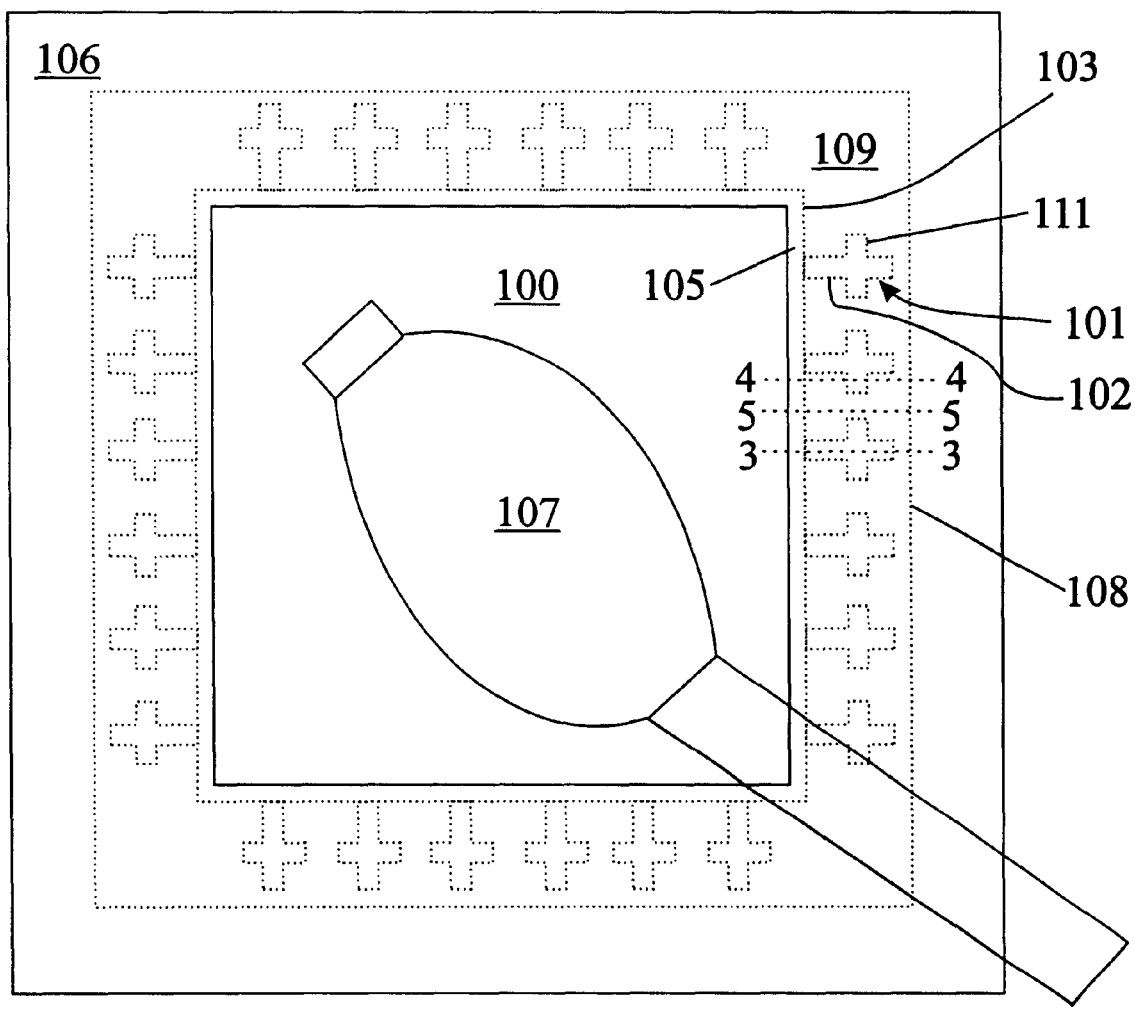
FIG. 2 is an illustrative schematic diagram showing the top view of the improved bond pad structure according to a preferred embodiment of the present invention which contains an array of dendritically shaped sub-structures outside of and along each of the four sides of the bond pad open area.

FIG. 2 is an illustrative schematic diagram showing the top view of an improved bond pad structure according to a preferred embodiment of the present invention which contains an array of cross-shaped dendritic sub-structures 101 outside of and along each of the four sides (i.e., edges) of a rectangularly-shaped bond pad 100. Each of the dendritic sub-structures has a long segment 102 which is perpendicular to the edge 103 of the bond pad 100, and a short segment 111 which is parallel to the edge 103 of the bond pad 100. The dendritic sub-structures 101 are formed into the dielectric layer 104. The dendritic sub-structures 101, the dielectric layer 104, and, optionally, a small edge portion 105 of the bond pad are covered by a passivation layer 106. A gold wire/ball 107 is bonded onto the bond pad 100. Dotted line 108 indicates the edge of the overhang portion 109 of the bond pad 100. The gold wire/ball can be replaced with an aluminum material.

Figure 3:
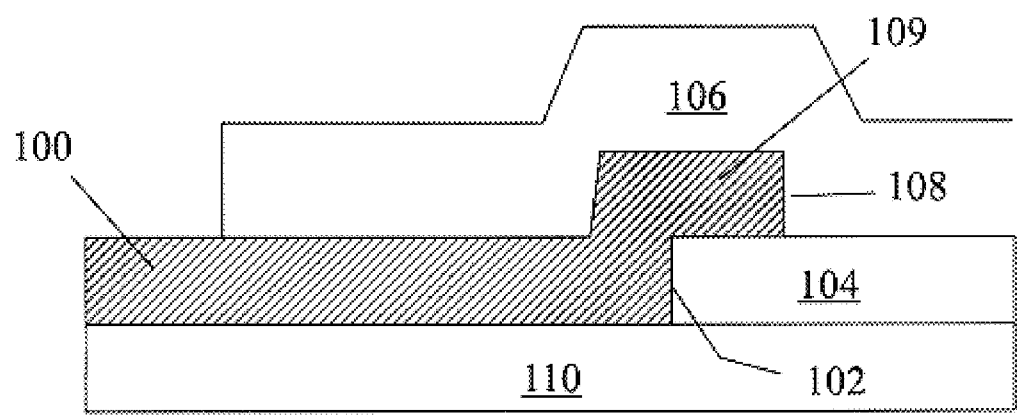
FIG. 3 is an illustrative schematic diagram showing a cross-sectional view along line 3–3' of the bond pad structure as shown in FIG. 2.

FIG. 3 is an illustrative schematic diagram showing a cross-sectional view along line 3–3' of bond pad structure as shown in FIG. 2 which travels along a long segment 102. In this Example 1, the thickness of the bond pad 100 is the same as that of the dielectric layer 104, and the long segment 102 of the dendritic sub-structure is simply an extension of the bond pad 100 from the edge 103 thereof. FIG. 3 shows that a small overhang portion is formed extending from the end of the long portion of the bond pad and is deposited on top of the dielectric layer. In this example, the underlying layer is a polysilicon layer, however, as discussed above, it can be a dielectric layer, a barrier layer, a metal compound layer (such as TiN, $WSi_x$, $TiSi_x$, etc.) or another metal layer.

Figure 4:
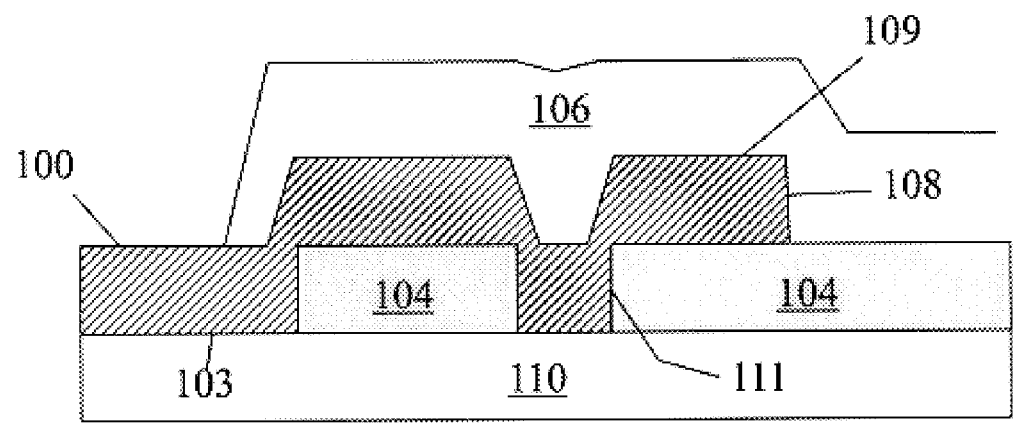
FIG. 4 is an illustrative schematic diagram showing a cross-sectional view along line 4–4' of the bond pad structure as shown in FIG. 2.

FIG. 4 is an illustrative schematic diagram showing a cross-sectional view along line 4–4' of bond pad structure as shown in FIG. 2 which travels across a short segment 111. The metal bond pad layer 100 extends from the edge of the bond pad, fills the through-hole and deposits on top of the dielectric, which becomes part of the overhang.

Figure 5:
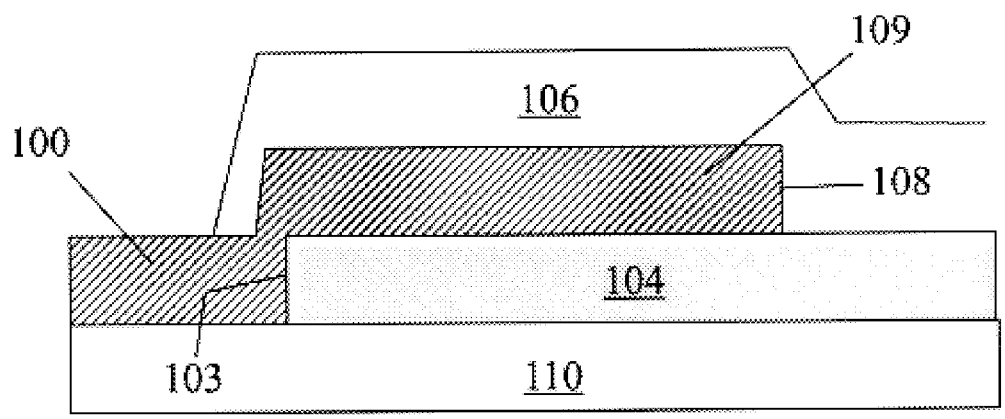
FIG. 5 is an illustrative schematic diagram showing a cross-sectional view along line 5–5' of the bond pad structure as shown in FIG. 2.

FIG. 5 is an illustrative schematic diagram showing a cross-sectional view along line 5–5' of bond pad structure as shown in FIG. 2. This portion is generally identical to that shown in FIG. 1, wherein the metal bond pad layer climbs up the sidewall of the dielectric layer, and forms an overhang above the dielectric layer. Because the present invention does not involve any anchoring structure in the bond pad area, the photoresist, which is used to form the dendritically shaped through-holes in the dielectric layer, can be removed prior to the deposition of the metal layer. This allows the overhang to be formed. If the photoresist is not removed during the metal deposition, then the overhang will not be formed.

EXAMPLE 2

Figure 6:
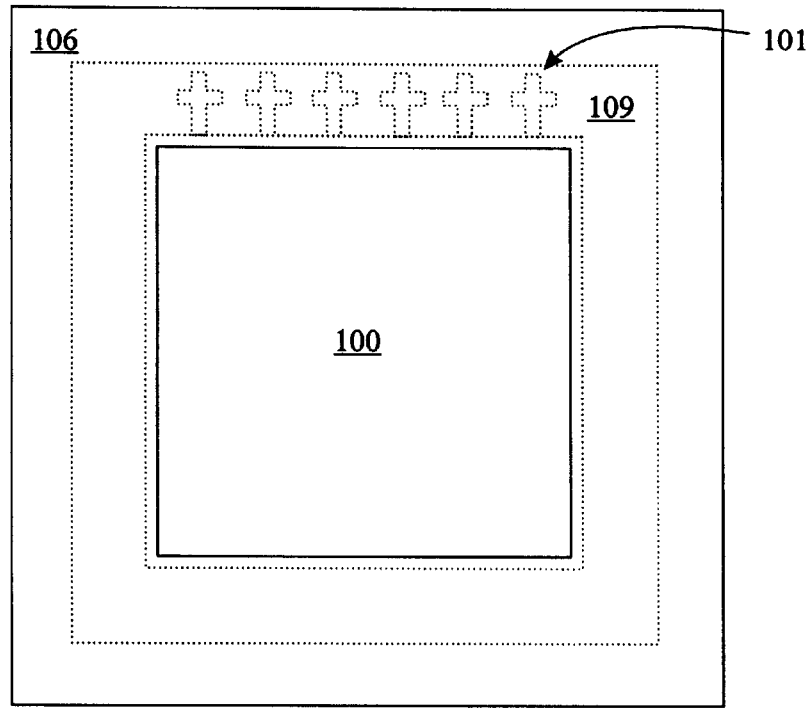
FIG. 6 is an illustrative schematic diagram showing the top view of the improved bond pad structure according to a second preferred embodiment of the present invention which contains an array of dendritically shaped sub-structures outside of and along only one side of the bond pad open area.

The bond pad structure in Example 2 is identical to that in Example 1, except that the dendritic sub-structures are formed only along one side of the bond pad, as shown FIG. 6.

EXAMPLE 3

Figure 7:
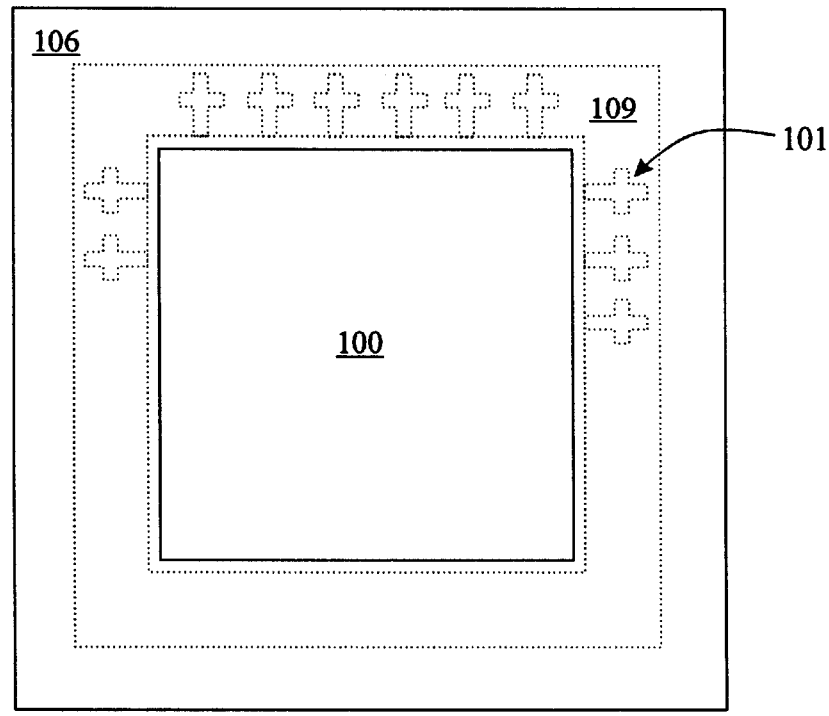
FIG. 7 is an illustrative schematic diagram showing the top view of the improved bond pad structure according to a third preferred embodiment of the present invention which contains an array of dendritically shaped sub-structures outside of and along one entire side and two partial adjacent sides of the bond pad open area.

The bond pad structure in Example 2 is identical to that in Example 1, except that the dendritic sub-structures are formed only along one entire side of the bond pad, and partially along two adjacent sides thereof, as shown FIG. 7.

EXAMPLE 4

Figure 8:
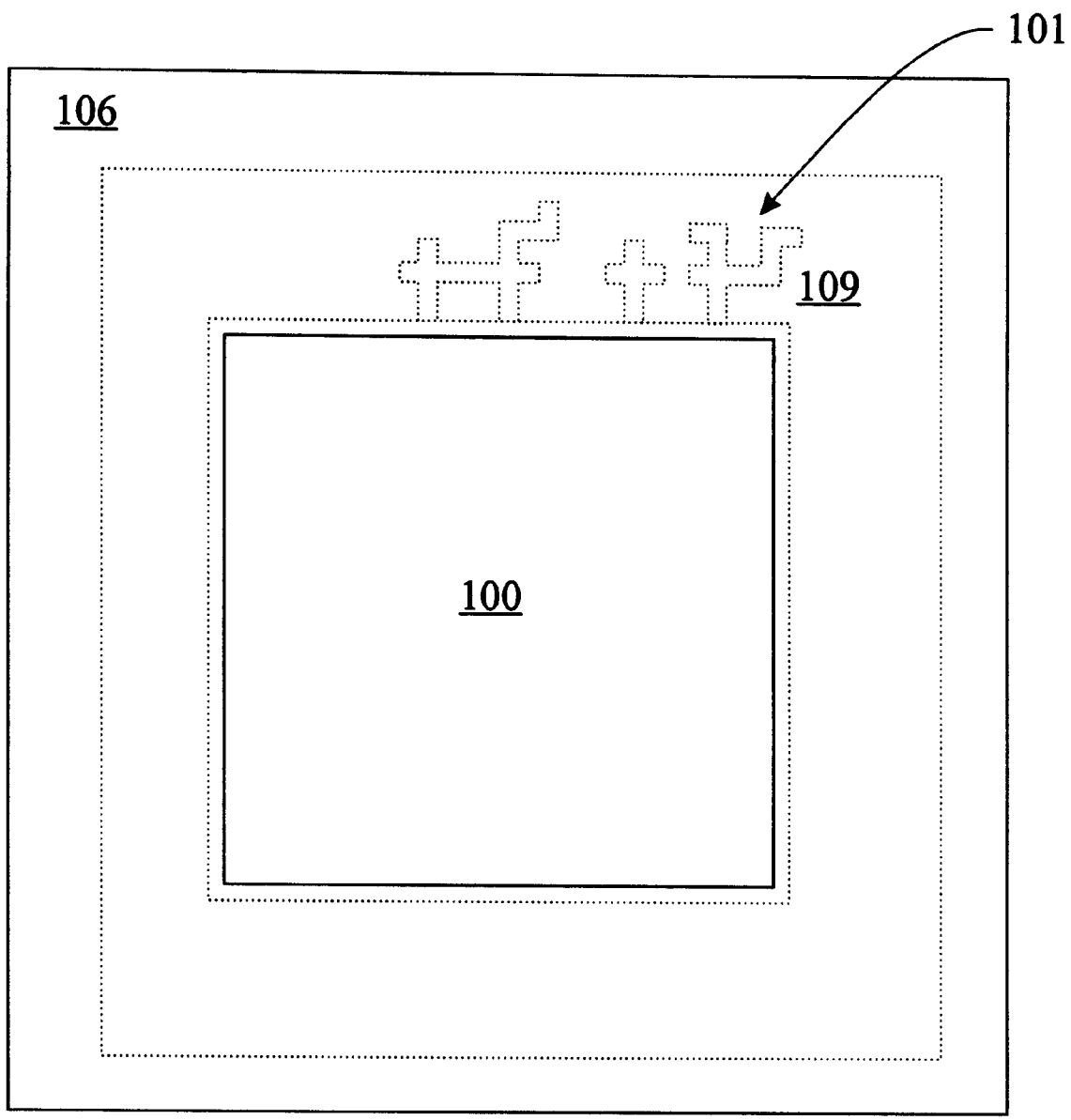
FIG. 8 is an illustrative schematic diagram showing the top view of the improved bond pad structure according to a fourth preferred embodiment of the present invention wherein the dendritically shaped sub-structure is further branched out by adding segments from the end of either the long segment or the short segment of the dendritically shaped sub-structure.

FIG. 8 shows that the dendritic sub-structure can further branch out by adding line segments to the end portion of the segments of the first level dendritic sub-structure.

Figure 9:
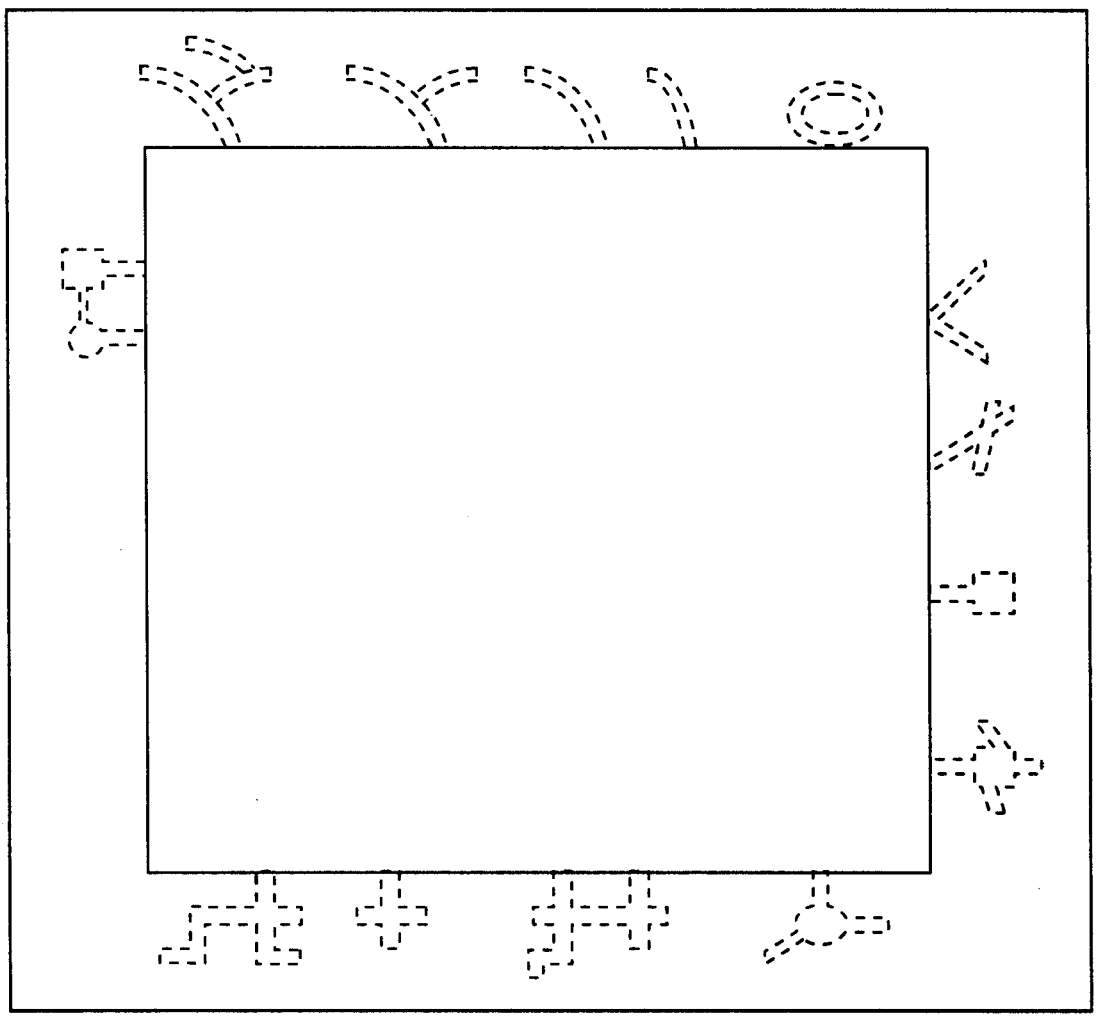
FIG. 9 is an illustrative schematic drawing showing that the dendritic sub-structure can be of any arbitrary shape; it can contain an elongated curved segment, an elongated straight segment, a bulky segment connected to said metal bond pad by a straight segment, or a mixture thereof.

FIG. 9 is an illustrative schematic drawing showing that the dendritic sub-structure can be of any arbitrary shape. The main purpose of the dendritic sub-structure is to provide extended surface for adhesion and to improve the shear force, as well as to create a discontinuity in the edge portion of the dielectric layer so as to intercept and stop the growth of cracks that may be formed due to stress. It can contain an elongated curved segment, an elongated straight segment, a bulky segment connected to said metal bond pad by a straight segment, or a mixture thereof. In order to effectively intercept crack growth in the direction perpendicular to the edge of the bond pad, it is preferred that the dendritic sub-structure contains at least a linear segment in the direction parallel to the edge of the bond pad, in addition to a linear segment in the direction perpendicular to the edge of the bond pad.

The foregoing description of the preferred embodiments of this invention has been presented for purposes of illustration and description. Obvious modifications or variations are possible in light of the above teaching. The embodiments were chosen and described to provide the best illustration of the principles of this invention and its practical application to thereby enable those skilled in the art to utilize the invention in various embodiments and with various modifications as are suited to the particular use contemplated. All such modifications and variations are within the scope of the present invention as determined by the appended claims when interpreted in accordance with the breadth to which they are fairly, legally, and equitably entitled.

What is claimed is:

1. A bond pad structure for use in wire bonding application during the packaging operation of semiconductor devices, comprising:
    (a) a conductive bond pad formed in a bond pad open window area surrounded by a dielectric layer; and
    (b) a plurality of spaced apart dendritic sub-structures formed around a periphery of said bond pad, said dendritic sub-structures also being surrounded by said dielectric layer;
    (c) wherein said dendritic sub-structure comprises a plurality of intersecting segments, each segment having a length and width both substantially smaller than those of said bond pad.

2. The bond pad structure according to claim 1, wherein said dendritic sub-structure comprises an elongated curved segment, an elongated straight segment, or a bulky segment connected to said metal bond pad by a straight segment, or a mixture thereof.

3. The bond pad structure according to claim 1, wherein said metal bond pad is rectangular in shape and has four edges.

4. The bond pad structure according to claim 3 which comprises four arrays of said dendritic sub-structures formed along said four edges, respectively, of said metal bond pad.

5. The bond pad structure according to claim 3 which comprises two arrays of said dendritic sub-structures formed along two adjoining edges of said metal bond pad.

6. The bond pad structure according to claim 5 which further comprises at least one additional array of said dendritic sub-structures formed at least partially along a third edge of said metal bond pad.

7. The bond pad structure according to claim 1 wherein said dendritic sub-structure contains a first straight segment and a second straight segment intersecting at an angle of greater than 0 but less than 180 degrees.

8. The bond pad structure according to claim 1 which further comprises an overhang portion extending from said metal bond pad and overlays said dielectric layer.

9. The bond pad structure according to claim 1, wherein said dendritic sub-structure is a generally cross-shaped structure containing a first segment which is generally perpendicular to an edge of said metal bond pad to which said dendritic sub-structure is connected, and a second segment with is generally parallel to said edge.

10. An integrated circuit which contains an improved bond pad structure with reduced bond pad lift-off problem, said bond pad structure comprising:
    (a) a conductive bond pad formed in a bond pad open window area surrounded by a dielectric layer; and
    (b) a plurality of spaced apart dendritic sub-structures formed around a periphery of said bond pad, said dendritic sub-structures also being surrounded by said dielectric layer;
    (c) wherein said dendritic sub-structure comprises a plurality of intersecting segments, each segment having a length and width both substantially smaller than those of said bond pad.

11. The integrated circuit according to claim 10, wherein said dendritic sub-structure comprises an elongated curved segment, an elongated straight segment, or a bulky segment connected to said metal bond pad by a straight segment, or a mixture thereof.

12. The integrated circuit according to claim 10, wherein said bond pad is rectangular in shape and has four edges.

13. The integrated circuit according to claim 12 wherein said bond pad structure comprises four arrays of said dendritic sub-structures formed along said four edges, respectively, of said bond pad.

14. The integrated circuit according to claim 12 wherein said metal bond pad structure comprises two arrays of said dendritic sub-structures formed along two adjoining edges of said metal bond pad.

15. The integrated circuit according to claim 14 wherein said bond pad structure further comprises at least one additional array of said dendritic sub-structures formed at least partially along a third edge of said metal bond pad.

16. The integrated circuit package according to claim 10 wherein said dendritic sub-structure contains at least one first straight segment and at least one second straight segment intercepting at a predetermined angle of greater than 0 but less than 180 degrees.

17. The integrated circuit package according to claim 10 wherein said bond pad structure further comprises an overhang portion extending from said bond pad and overlaying said dielectric layer.

18. The integrated circuit package according to claim 10 wherein said dendritic sub-structure has a first segment which is generally perpendicular to an edge of said open window area to which said dendritically shaped through hole is connected, and a second segment with is generally parallel to said edge of said open window area.

19. The bond pad structure according to claim 1 which further comprises an overhanging portion wherein said overhanging portion extends from said periphery of said conductive bond pad and overlays on said dielectric such that said overhanging portion is in a stepped-up relationship with respect to said bond pad, and said dendritic sub-structures are formed as part of said overhanging portion but are recessed into said dielectric layer.

20. The integrated circuit according to claim 10 which further comprises an overhanging portion wherein said overhanging portion extends from said periphery of said conductive bond pad and overlays on said dielectric such that said overhanging portion is in a stepped-up relationship with respect to said bond pad, and said dendritic sub-structures are formed as part of said overhanging portion but are recessed into said dielectric layer.

21. A pad structure for use in wire bonding application during the packaging operation of semiconductor devices, comprising:

(a) a conductive bond pad formed in a bond pad open window area surrounded by a dielectric layer;

(b) an overhanging portion which extends from a periphery of said conductive bond pad and overlays on said dielectric such that said overhanging portion is in a stepped-up relationship with respect to said bond pad; and (c) at least one dendritic sub-structure which is formed as part of said overhanging portion but is recessed into said dielectric layer;

(d) wherein said dendritic sub-structure comprises a plurality of intersecting segments, each segment having a length and width both substantially smaller than those of said bond pad.

* * * * *